United States Patent
Makanoeich et al.

(10) Patent No.: US 10,297,584 B2
(45) Date of Patent: May 21, 2019

(54) CHIP ON BOARD LED DEVICE AND METHOD

(71) Applicant: Light To Form, LLC, Northbrook, IL (US)

(72) Inventors: Shoubert Makanoeich, Saint Charles, IL (US); Nelson Caldani, Richboro, PA (US); Eric Bretschneider, Corinth, TX (US)

(73) Assignee: Light To Form, LLC, Northbrook, IL (US)

( * ) Notice: Subject to any disclaimer, the term of this patent is extended or adjusted under 35 U.S.C. 154(b) by 0 days.

(21) Appl. No.: 15/927,458

(22) Filed: Mar. 21, 2018

(65) Prior Publication Data

US 2018/0286837 A1    Oct. 4, 2018

Related U.S. Application Data

(60) Provisional application No. 62/474,367, filed on Mar. 21, 2017.

(51) Int. Cl.
*H01L 25/16* (2006.01)
*H01L 33/50* (2010.01)
(Continued)

(52) U.S. Cl.
CPC ........ *H01L 25/167* (2013.01); *H01L 25/0753* (2013.01); *H01L 33/504* (2013.01);
(Continued)

(58) Field of Classification Search
CPC ............ H05B 33/0827; H05B 33/0812; H05B 33/0815; H05B 33/0824; H05B 33/0857; H05B 33/0806; H05B 33/0845; H05B 33/086; H05B 33/0887; H05B 33/089; H05B 37/02; H05B 37/032; F21V 29/004; F21V 23/005; F21V 29/70; Y02B 20/345; Y02B 20/347; F21K 9/238; F21Y 2115/10; H01L 25/167; H01L 25/0753; H01L 33/504; H01L 33/505; H01L 33/54; H01L 33/62; H01L 33/0827; H01L 33/0857; H01L 33/32; H01L 33/486; H01L 33/507;
(Continued)

(56) References Cited

U.S. PATENT DOCUMENTS 6,812,068 B2 * 11/2004 Brand .................... H01L 21/56
                                                              257/E21.502
7,088,059 B2    8/2006 McKinney et al.
(Continued)

*Primary Examiner* — Vibol Tan
(74) *Attorney, Agent, or Firm* — Erickson Law Group, PC

(57) ABSTRACT

A LED device is disclosed. The device has a LED area, a boundary element surrounding the LED area, a plurality of chip scale package LEDs in the LED area, a plurality of flip chip LEDs in the LED area, an encapsulate, a first conductive path, and a second conductive. The encapsulate covers the plurality of chip scale package LEDs and the plurality of flip chip LEDs in the LED area. The encapsulate has phosphor. The first conductive path connects the plurality of chip scale package LEDs. The second conductive path connects the plurality of flip chip LEDs. The plurality of chip scale package LEDs and the plurality of flip chip LEDs in the LED area are arranged in rows. Each row comprises alternating chip scale package LEDs and flip chip LEDs.

21 Claims, 17 Drawing Sheets

(51) Int. Cl.
*H01L 33/08* (2010.01)
*H01L 33/54* (2010.01)
*H01L 33/62* (2010.01)
*H05B 33/08* (2006.01)
*H01L 25/075* (2006.01)
*H01L 33/48* (2010.01)
*H01L 33/64* (2010.01)
*H01L 33/32* (2010.01)

(52) U.S. Cl.
CPC ............ *H01L 33/505* (2013.01); *H01L 33/54* (2013.01); *H01L 33/62* (2013.01); *H05B 33/0827* (2013.01); *H05B 33/0857* (2013.01); *H01L 33/32* (2013.01); *H01L 33/486* (2013.01); *H01L 33/507* (2013.01); *H01L 33/644* (2013.01); *H01L 2933/005* (2013.01); *H01L 2933/0033* (2013.01); *H01L 2933/0091* (2013.01)

(58) Field of Classification Search
CPC ........... H01L 33/644; H01L 2933/0033; H01L 2933/005; H01L 2933/0091
See application file for complete search history.

(56) References Cited

U.S. PATENT DOCUMENTS

| | | | |
|---|---|---|---|
| 9,018,655 B2* | 4/2015 | Tu | H01L 33/52 257/96 |
| 9,046,228 B2 | 6/2015 | Tanaka et al. | |
| 9,412,724 B2* | 8/2016 | Weng | H01L 25/0753 |
| 9,477,032 B2* | 10/2016 | Song | H01L 33/486 |
| 9,490,404 B2* | 11/2016 | Weng | H01L 24/97 |
| 9,978,915 B2* | 5/2018 | Weng | H01L 24/97 |
| 2008/0315228 A1 | 12/2008 | Krames et al. | |
| 2011/0266560 A1 | 11/2011 | Yao et al. | |
| 2013/0092962 A1 | 4/2013 | Paek et al. | |
| 2013/0207136 A1 | 8/2013 | Cheng et al. | |
| 2015/0008462 A1* | 1/2015 | Weng | H01L 24/97 257/98 |
| 2015/0022114 A1 | 1/2015 | Kim | |
| 2017/0196060 A1 | 7/2017 | Watanabe et al. | |

* cited by examiner

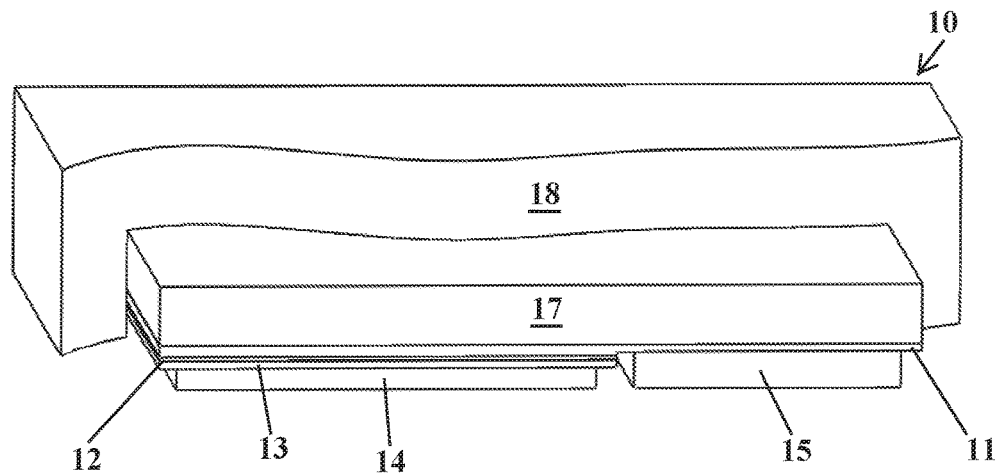
FIG. 1 - Prior Art
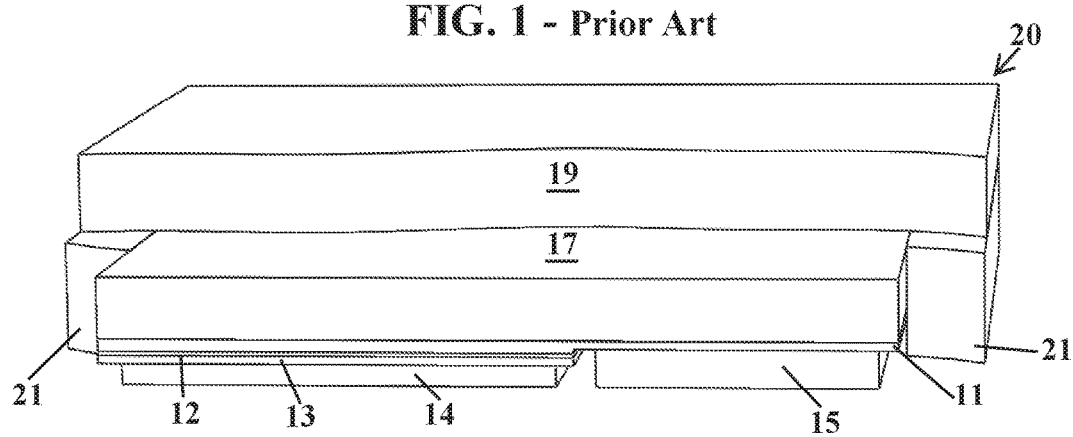
FIG. 2 - Prior Art
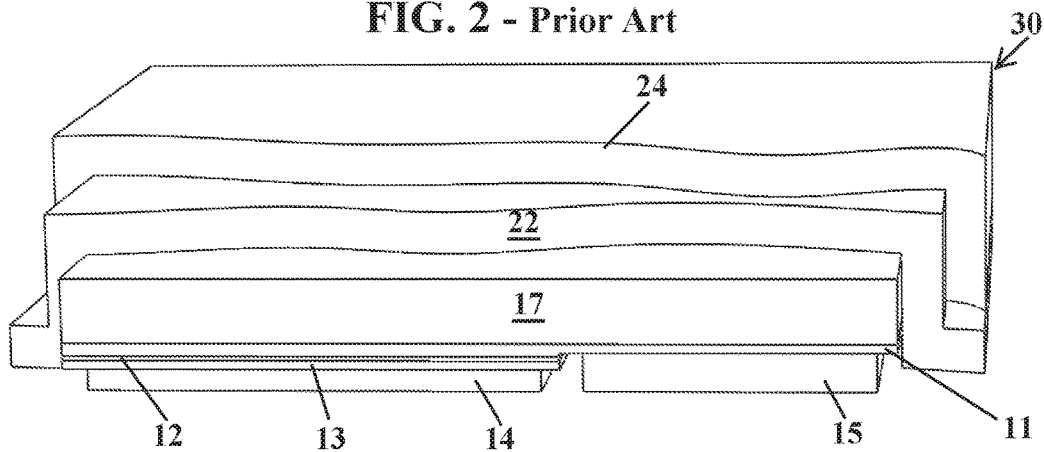
FIG. 3 - Prior Art

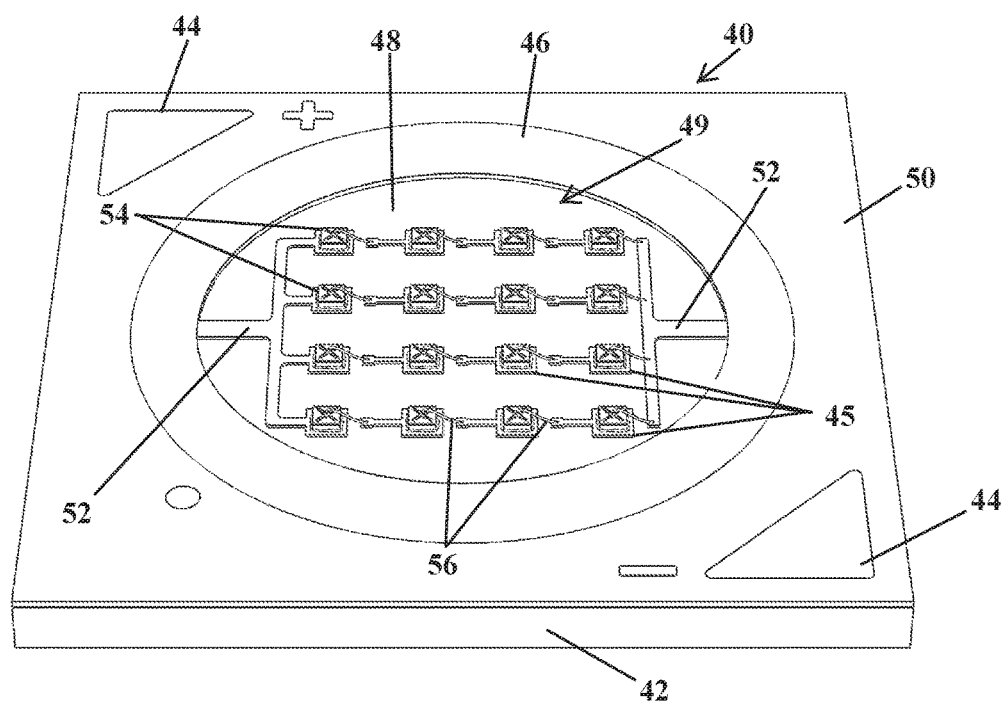
FIG. 4 - Prior Art

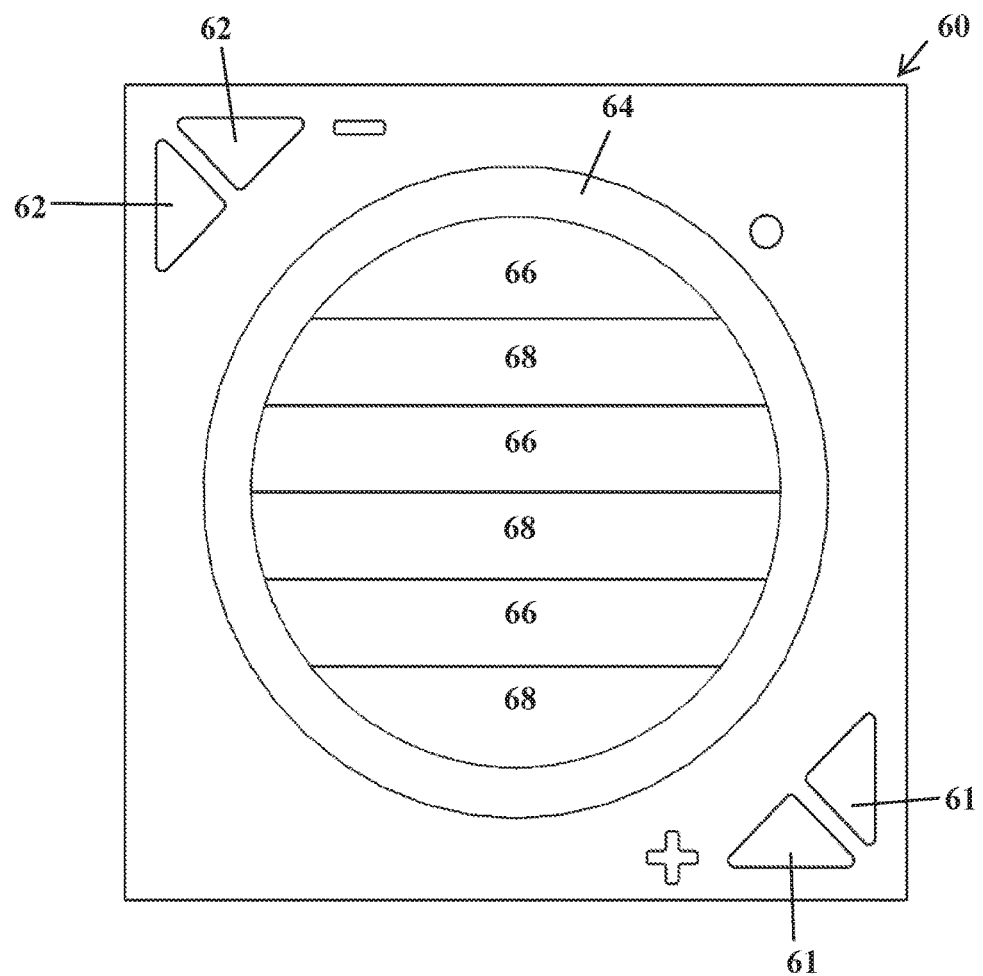
FIG. 5 -Prior Art

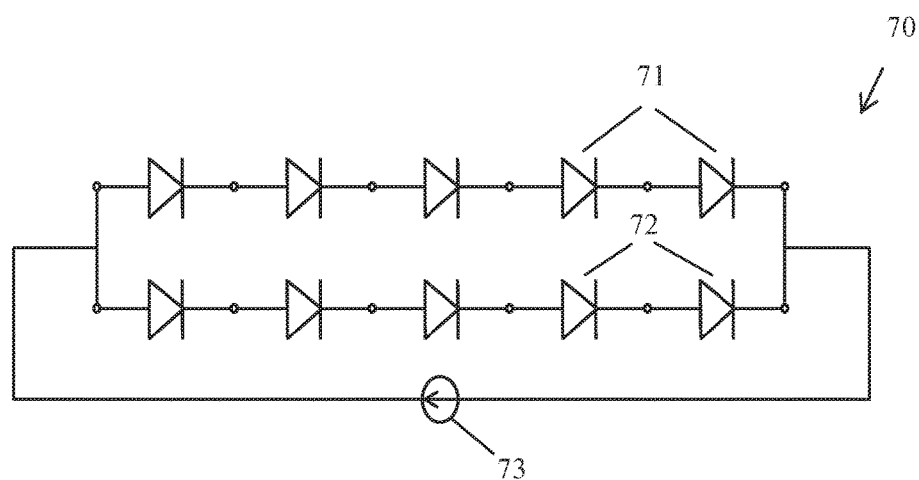
FIG. 6 – Prior Art
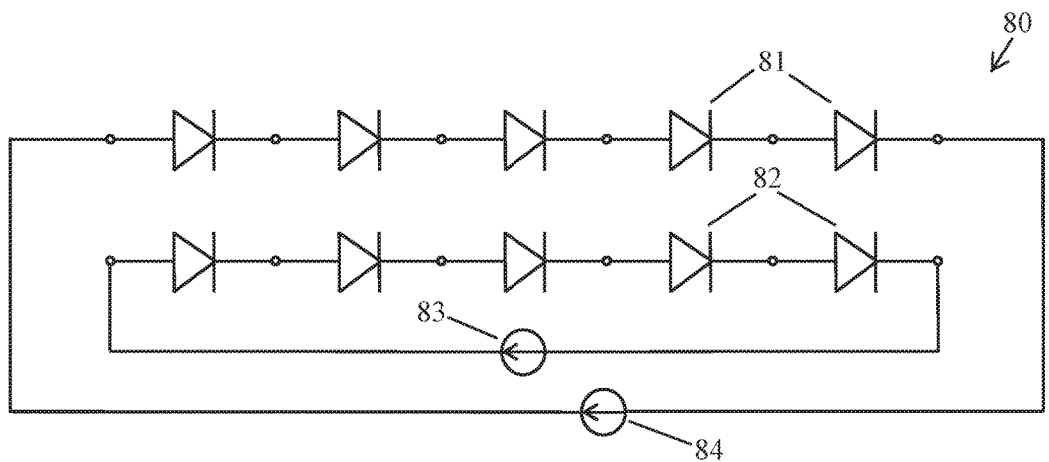
FIG. 7 – Prior Art

| VRD Resistance (Ω) | Effective Voltage | | Current (mA) | | | Current Ratio |
|---|---|---|---|---|---|---|
| | String 1 | String 2 | String 1 | String 2 | TOTAL | |
| 2300.3 | 30.28 | 38.20 | 16.61 | 333.39 | 350.00 | 20.08 |
| 1428.0 | 30.81 | 38.00 | 26.61 | 323.39 | 350.00 | 12.15 |
| 725.0 | 31.81 | 37.50 | 51.72 | 298.28 | 350.00 | 5.77 |
| 481.5 | 32.59 | 37.00 | 76.84 | 273.16 | 350.00 | 3.55 |
| 358.5 | 33.27 | 36.50 | 101.81 | 248.19 | 350.00 | 2.44 |
| 284.7 | 33.88 | 36.00 | 126.46 | 223.54 | 350.00 | 1.77 |
| 235.7 | 34.44 | 35.50 | 150.63 | 199.37 | 350.00 | 1.32 |
| 201.0 | 34.96 | 35.00 | 174.15 | 175.85 | 350.00 | 1.01 |

CHIP ON BOARD LED DEVICE AND METHOD

This application claims the benefit of U.S. Patent Application No. 62/474,367, filed Mar. 21, 2017.

FIELD OF THE INVENTION

The present invention relates to a chip on board LED devices and methods.

BACKGROUND

In conventional Light Emitting Diodes (LEDs), a phosphor containing material is placed directly on top of the p-n junction of the LED so that both heat sources are directly adjacent to each other. Heat may be conducted through a sapphire substrate to the mounting material of the LED chip, but because sapphire is a poor thermal conductor compared to metallic materials, this is not very efficient.

In the field of LEDs, there are at least two general classes of devices with small area, high luminous flux light emitting surfaces (LESs). They are Chip Scale Packages (CSPs) and Chip on Board (COB) devices. CSPs may be defined by a ratio between the area of the LED chip and the total area of the package. COB devices incorporate a relatively large number of closely spaced LED chips in one or more arrays that are mounted on a metal core circuit board.

In contrast to conventional LEDs, the present inventors recognized that in a CSP, the p-n junction of the CSP LED chip is located adjacent to the circuit board the LEDs are mounted on. This reduces the thermal resistance between the p-n junction and the package. In addition, the phosphor materials are located on the opposite side of the sapphire substrate so the amount of heat that is conducted from the p-n junction of the LED to the phosphor materials is greatly reduced. This combination of factors greatly reduces the junction operating temperature of CSP LEDs compared to other LED devices.

One type of CSP LED comprises a so-called flip-chip LED with a sapphire substrate. The term flip-chip refers to the chip being mounted with the sapphire substrate side facing up. In this orientation, the positive and negative electrodes of the LED are located on the base or bottom surface of the LED chip when it is mounted. Electrical contact is made using thermosonic bonding or a type of solder attach. The solder used to make electrical connections may be a traditional solder material or a eutectic solder.

White CSP LEDs incorporate a phosphor film. A portion of the light emitted by the LED chip is absorbed by the phosphor material(s) and re-emitted at different wavelengths. The combination of light emitted from the LED chip and the light emitted by the phosphor is perceived as white. The ratio of the light emitted by the LED chip to the light emitted by the phosphor as well as composition of the phosphor determines the spectral power distribution of the LED device. In turn the spectral power distribution determines the chromaticity coordinates of the LED, the Correlated Color Temperature (CCT) and the color rendering properties.

Prior CSP LEDs had one of three different configurations. These configurations are shown in FIGS. 1 through 3. In each configuration, the bottom surface of the LED flip-chip 10, 20, 30 is exposed to allow solder connections. In the first configuration LED flip-chip 10 of FIG. 1, the phosphor material 18 covers the top and sidewalls of the LED chip. In the second configuration LED flip-chip 20 of FIG. 2, phosphor material 19 covers the top of the LED and white reflective materials 21 cover the sides of the LED flip chip. In the third configuration LED flip-chip 30 of FIG. 3, phosphor material 22 covers the top and sidewalls of the LED, however a transparent polymeric material 24 covers the phosphor materials so that no phosphor materials are directly exposed. The present inventors recognized that covering the sides of the LED flip-chip makes the packages larger and also requires additional processing steps. The present inventors recognized the need for a LED flip-chip that has a smaller footprint and allows a more simplified manufacturing process.

Each of the LEDs of FIGS. 1 through 3 have a sapphire substrate 17. Below the substrate 17 is one or more n-type layers 11. A buffer layer may be provided between the substrate 17 and the n-type layers 11. On the n-type layers 11 is the active region 12. The active region 12 is a series of thin layers with varying composition. The varying compositions of the active region 12 may comprise alternating layers of GaN and Indium Gallium Nitride (InGaN). After the active region 12 is provided, a series of p-type layers 13 are provided.

After deposition of the entire LED structure, the substrate 17 with the various parts of the LED structure are then processed to form a completed LED die. Since the sapphire substrate 17 is electrically insulating, portions of the p-type layer 13 and the active region 12 as well as a portion of the n-type layers 11 are etched away to expose a surface of the n-type layers 11. Electrical contacts 14, 15 are formed on top of the p-type layer and n-type layer and the device is separated to form a completed LED die.

The present inventors recognized the need for a flip chip LED that provides a different spectral power distribution emitted from the top of the flip chip LED than from the side of the flip chip LED.

To make one type of traditional COB device, a dam structure is formed around the area where the LED chips are bonded. The dam may be formed before or after the LED chips are mounted. The region inside the dam is then filled with phosphor/silicone mixture that is then allowed to cure. The present inventors recognized that the chromaticity coordinates and hence CCT and color rendering properties of traditional COB devices are fixed during production and cannot be tuned or adjusted. The present inventors recognized the need for a COB device where the chromaticity coordinates, the CCT, and/or color rendering can be adjusted after production.

One prior art COB device 40 utilizes a single type of LED die 54 mounted on a metallic support 42, as shown in FIG. 4. Dielectric layers (not shown) are coated on a major surface of the metallic support to provide electrical isolation. Electrically conductive traces 52 are formed on the dielectric layer to form a partial electrical circuit. These electrically conductive traces 52 are connected to a power source via external electrical contacts 44 to allow the LED dies 54 to be powered. LED dies 54 are mounted on bonding pads 45 and connected to the electrically conductive traces 52 to form a series/parallel array of LED devices. The LED bonding pads 45 are disposed inside a raised polymeric material called a dam 46. The dam 46 defines the LED bonding area 49 along with the LED bonding pads 45. After the LED dies 54 have been placed and connected to the electrically conductive traces 52, the interior of the dam is filled with a transparent thermosetting resin encapsulating material (not shown). White COB devices may be produced using blue light emitting GaN based LEDs where one or more phosphor materials are dispersed in the thermosetting encapsulating resin disposed inside the dam 46. The present inventors recognized that COB LED devices with a single pair of external electrical contacts 44 are not capable of altering their emitted spectral power distribution.

The COB device 40 uses individual LED dies and least one wire bond 56. The present inventors have recognized that these wire bonds 56 are fragile and may be susceptible to damage during assembly or installation of the COB LED device in a fixture. The present inventors have recognized that it would desirable to eliminate the use of fragile wire bonds.

COB LED devices 60 have been developed that include two pairs of external electrical contacts 62, 61, as shown in FIG. 5. In these COB devices, the LED die corresponding to each set of external electrical contacts 62, 61 are arranged in alternating rows. In devices with two pairs of external electrical contacts 62, 61, the first set of LEDs inside the dam 64 are encapsulated with a first phosphor material 66 while the second set of LEDs inside the dam 64 are encapsulated with a second phosphor material 68. The first set of LEDs and their encapsulating first phosphor material 66 and the second set of LEDs and their encapsulating second phosphor material 68 are thus formed in alternative lines.

When an electrical current is passed through the first set of LEDs encapsulated with a first phosphor material 66 a first spectral power distribution of light is emitted. When an electrical current is passed through the second set of LEDs encapsulated with a second phosphor material 68 a second spectral power distribution of light is emitted. By adjusting the electrical current through the first set of LEDs and the second set of LEDs, the color tunable COB may emit a net spectral power distribution that is a mixture of the first spectral power distribution and the second spectral power distribution.

The present inventors recognized that these prior art color tunable COB LEDs exhibit significant variations in perceived color over angle. The viewer will notice that the color emitted from the first phosphor material 66 is different from the color emitted from the second phosphor material 68. Therefore, the COB device will have a striped appearance from the differing emissions from the alternating rows. The present inventors recognized that this COB device suffers from poor color mixing, especially in the near field. The present inventors recognized it would be desirable to provide a color tunable COB device with increased apparent color uniformity between different sets of LEDs contained in the COB.

The present inventors further recognized that there is a relationship between efficiency or efficacy of LED and the phosphor materials used to produce a certain CCT and color rendering property. This in turn results in non-uniform emission intensity across the LES that correlates with the color mixing issues. The present inventors recognized the need for a COB device with post-manufacturing color mixing capabilities as well as improved color mixing capabilities.

The present inventors recognized that certain CSP LEDs are relatively fragile and easy to damage. This complicates handling and mounting the CSP based COB devices. Great caution must be used during assembly to prevent damage. This sensitivity to physical damage may also necessitate design changes that increase complexity and production cost. The gaps between the CSP packages also act as dirt and dust traps. This makes CSP based COB devices much more sensitive to dirt depreciation, e.g. loss of light due to dirt accumulation on the device. The present inventors recognized the need for a device where the CSP LEDs are better protected against damage and dirt depreciation.

The present inventors has recognized that prior arrangements for powering LEDs in COB devices either lack the ability to provide different current to different set of LEDs or comprise additional cost and complexity. One type of static color mixing of LEDs in COB devices has a first set of LEDs 71 connected in parallel with a second set of LEDs 72. Each LEDs may be connected in series within a set of LEDs 71, 72. In the configuration of FIG. 6, both sets of LEDs 71, 72 are powered by a single current source 73. Increasing or decreasing the current delivered to the LED array by the single current source 73 results in increasing or decreasing amount of light being emitted by each set of LEDs 71, 72 with no significant shifts in perceived color or relative spectral power distribution. The present inventors recognized that it would be desirable to independently control the power delivered to different sets of LEDs.

One type of dynamic color mixing of LEDs uses a first set of LED 81 connected to a first current source 84 and a second set of LED 82 connected to a second current source 83. The first current source is independent of the second current source. Each LED may be connected in series within a set of LEDs 81, 82, as shown in FIG. 7. In order to allow color tuning, the first string of LEDs 81 must emit a different spectral power distribution than the second string of LEDs 82. By changing the current delivered to the first set of LEDs 81 by the first current source 84 and the current delivered to the second set of LEDs by the second current source 83, the perceived color of the resulting spectral power distribution can be formed as some mixture of the two spectral power distributions. The present inventors recognized that using independent current sources for each set of LEDs adds cost and complexity to the resulting light source. The present inventors recognized the need for independent control of power delivered to different sets of LEDs while avoiding the cost and complexity of using independent current sources for each set.

SUMMARY

A LED lighting device is disclosed. In one embodiment, the device has a LED area, a boundary element surrounding the LED area, a plurality of chip scale package LEDs in the LED area, a plurality of flip chip LEDs in the LED area, an encapsulate, a first conductive path, and a second conductive. The encapsulate covers the plurality of chip scale package LEDs and the plurality of flip chip LEDs in the LED area. The encapsulate comprises phosphor. The first conductive path connects the plurality of chip scale package LEDs. The second conductive path connects the plurality of flip chip LEDs. The plurality of chip scale package LEDs and the plurality of flip chip LEDs in the LED area are arranged in one or more rows. Each row comprises alternating chip scale package LEDs and flip chip LEDs.

A method of manufacturing a LED lighting device is disclosed. A plurality of a plurality of chip scale package LEDs and a plurality of flip chip LEDs are arranged in one or more rows wherein each row comprises alternating chip scale package LEDs and flip chip LEDs. The plurality of chip scale package LEDs are connected to a first conductive path in the LED area. The plurality of flip chip LEDs are connected to a second conductive path in the LED area. A liquid encapsulating material is dispensed into the LED area, which is bounded by a dam member. The liquid encapsulating material is allowed to level by gravity. The liquid encapsulating material is then cured.

Numerous other advantages and features of the present invention will become readily apparent from the following detailed description of the invention and the embodiments thereof, from the claims, and from the accompanying drawings.

BRIEF DESCRIPTION OF THE DRAWINGS

FIG. 1 is a side perspective view of a first prior art flip chip LED.

FIG. 2 is a side perspective view of a second prior art flip chip LED.

FIG. 3 is a side perspective view of a third prior art flip chip LED.

FIG. 4 is a perspective view of a first prior art chip on board device.

FIG. 5 is a perspective view of a second prior art chip on board device.

FIG. 6 is a diagram of a first prior art LED power arrangement.

FIG. 7 is a diagram of a second prior art LED power arrangement.

DETAILED DESCRIPTION OF THE EMBODIMENTS

Figure 8A:
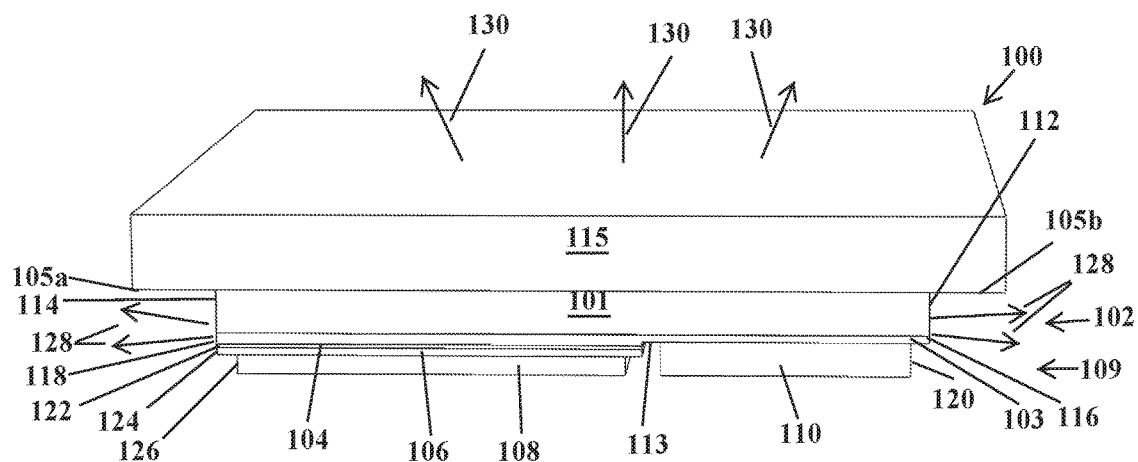
FIG. 8A is a side perspective view of a flip chip LED of one embodiment of the present invention.

The following description is presented to enable any person skilled in the art to make and use the invention. For the purposes of explanation, specific nomenclature used provides a plural understanding of the present invention. While this invention is susceptible of embodiment in many different forms, the drawings and this description demonstrate specific embodiments of the invention with the understanding that the present disclosure is to be considered as an exemplification of the principles of the invention and is not intended to limit the invention to the specific embodiments illustrated.

A flip chip LED (LED) 100 is disclosed. In some embodiments, the LED 100 is a Gallium Nitride (GaN) based LED. The LED 100 comprises substrate 101, which may be sapphire. On and below the substrate 101 is one or more n-type layers 103. A buffer layer may be provided between the substrate 101 and the n-type layers 103. On the n-type layers 103 is the active region 104. The active region 104 is commonly a series of thin layers. In some embodiments, the thin layers of the active region 104 comprises alternating layers of GaN and Indium Gallium Nitride (InGaN). After the active region 103 is provided, a series of p-type layers 106 are provided.

The LED 100 may be grown by deposition. In such process, a buffer layer is optionally provided on the substrate 101. Then a plurality of n-type layers 103 are grown or deposited on the buffer layer or on the substrate 101. Then the active region 104 is grown or deposited on the n-type layers 112. Then a plurality of p-type layers 106 are grown or deposited on the n-type layers.

After deposition of the LED 100 structure, it is then processed to form a completed LED die. When a sapphire substrate 101 is used, it is electrically insulating. Therefore the portions of the p-type layer 106 and the active region 104 as well as a portion of the n-type layers 103 are etched away to expose a surface 113 of the n-type layers 103. An electrical contact 108 is formed or provided on top 124 of the p-type layer 106. An electrical contact 110 is formed or provided on top 113 of the n-type layer 103. The reference to tops 113 and 124 as a top recognizes that the LED 100 can be formed up-side down and then inverted when deployed. The elements 103, 104, 106, 108, 110 may be referred to herein collectively as substrate mounted elements 109.

In some embodiments, a phosphor material(s) 115 may be provided on the substrate 101 opposite of the n-type layers 103. However, phosphor material or reflective material is not provided on the sides of the LED 100, as shown in FIG. 8A. Therefore, no phosphor material or reflective material covers the first side 112 of the substrate 101, or the first side 116 of the n-type layers 103, or the first side 120 of the electrical contact 110 when the LED 100 is outside of a CSP LED or COB device. Further, no phosphor material or reflective material covers the second side 114 of the substrate 101, or the second side 118 of the n-type layers 103, or the second side 122 of the active region 104, or the second side 231 of the p-type layers 106, or the second side 126 of the electrical contact 108 when the LED 100 is outside of a CSP LED or COB device. In some embodiments, the phosphor material 115 may overhang 105a, 105b at the sides of the substrate and other elements, as shown in FIG. 8A.

Figure 9:
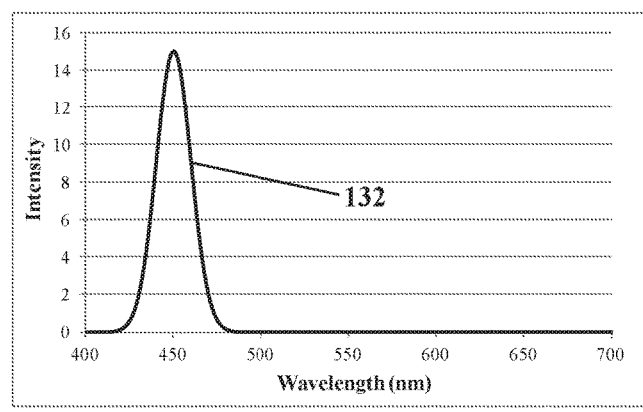
FIG. 9 is a chart of an exemplary spectral power distribution of light emitted from a side of one embodiment of the flip chip of FIG. 8.
Figure 10:
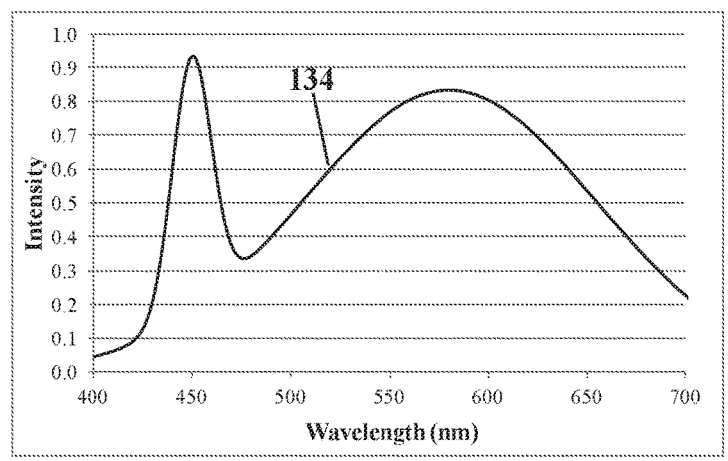
FIG. 10 is a chart of an exemplary spectral power distribution of light emitted from a top of one embodiment of the flip chip of FIG. 8.

The lack of phosphor or reflective material on the sides of the LED enables differences, which may be significant, in the spectral power distribution 132 of light emitted from the side 128 of the LED 100 and the spectral power distribution 134 of light emitted from the top 130 of the LED 100. FIG. 9 shows an exemplary spectral power distribution 132 of light emitted from the side 128 of the LED 100. FIG. 10 shows an exemplary spectral power distribution 134 of light emitted from the top 130 of the LED 100. The difference in the spectral power distribution from the light emitted at the sides verses the top of the LED is beneficial in at least one deployment in a COB device, such as chip-on-board device 200.

Figure 8B:
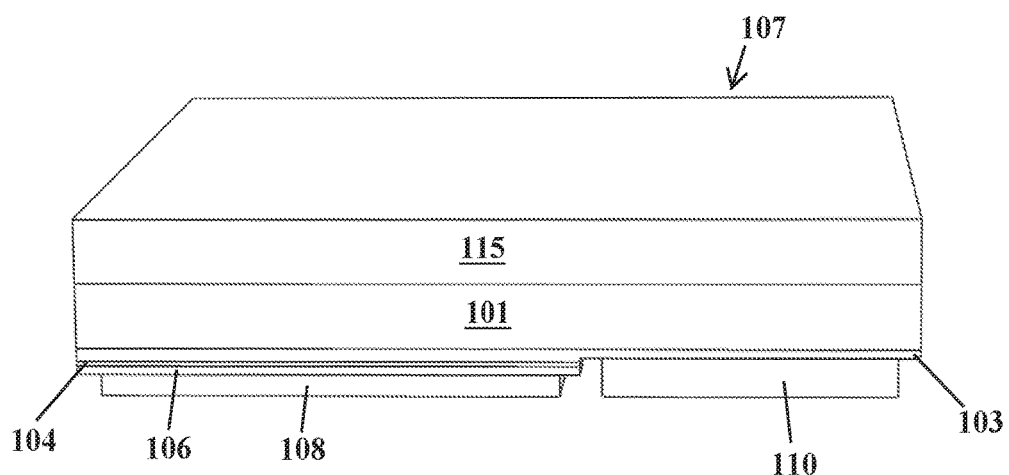
FIG. 8B is a side perspective view of a flip chip LED of another embodiment of the present invention.

In some embodiments, the LED 100 does not comprise a phosphor material(s) 115 above the substrate 101, in which case the LED is referred to with numeral 102. In some embodiments, LED 100 does not have an overhang 105a, 105b as shown with LED 107 of FIG. 8B.

Figure 11:
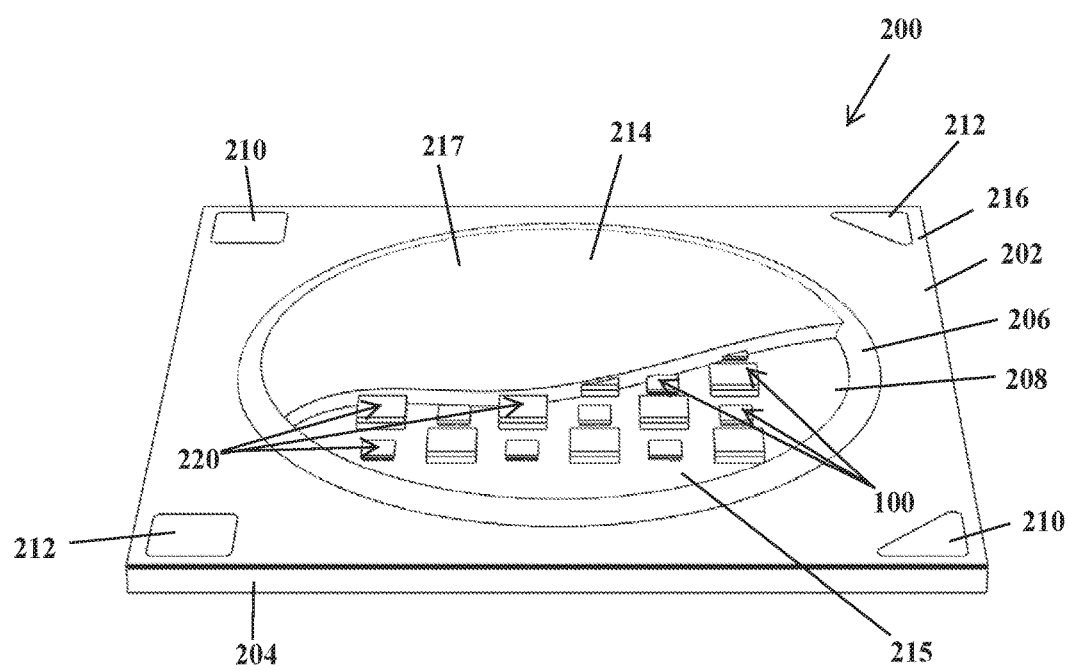
FIG. 11 is a perspective partial cut-away view of one embodiment of a chip on board (COB) device of the present invention.
Figure 12:
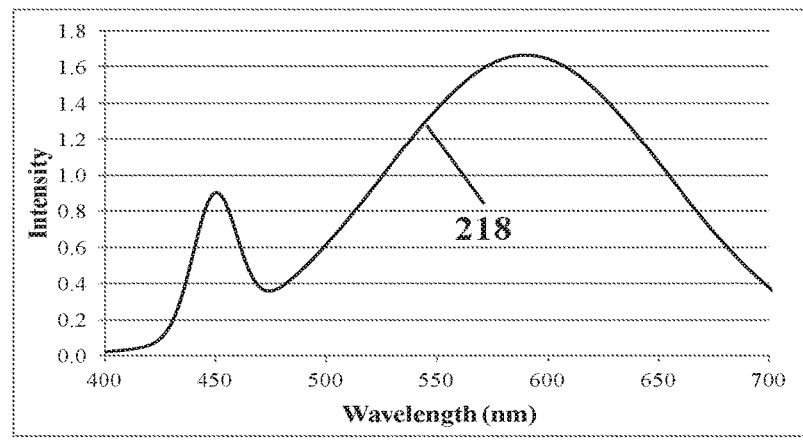
FIG. 12 is a chart of an exemplary spectral power distribution of light emitted from a first type of LED within the COB DEVICE of FIG. 11.
Figure 13:
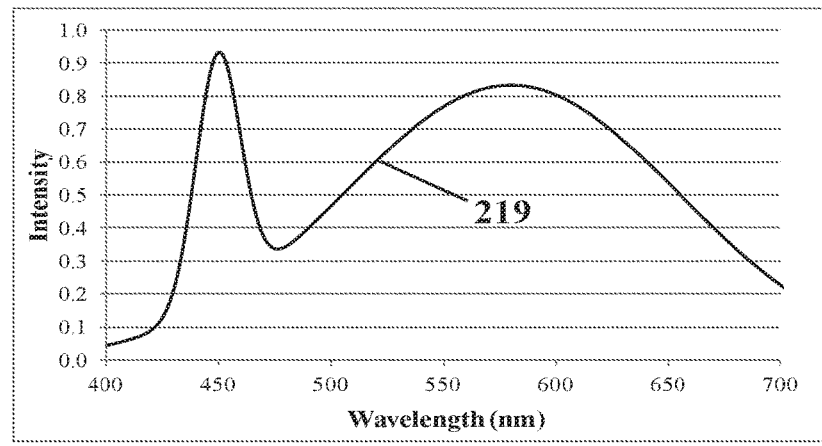
FIG. 13 is a chart of an exemplary spectral power distribution of light emitted from a second type of LED within the COB device of FIG. 11.

A chip-on-board (COB) device 200 is shown in FIG. 11. This device 200 comprises a plurality of flip chip LEDs 100 and a plurality of CSP LEDs 220. The flip chip LEDs and the CSP LEDs are encapsulated by an encapsulant 214. The encapsulant comprises a phosphor. The device 200 has a housing 202. The housing may comprise a support 204, which may be metallic. The housing comprises an LED area 208, which is where the LEDs are bonded. One or more dielectric layers (not shown) may be coated on the major surface of the support 204 to provide electrical isolation. The LED area 208 is surrounded by a perimeter wall or dam 206. While the perimeter wall 206 is shown circular, the LED area 208 could comprise non-circular shapes, such as a polygon, a square, a rectangle, an oval, rounded, etc. Therefore the perimeter wall may be a plurality of perimeter walls defining the LED area according to the LED area shape.

The floor 215 of the LED area 208 is lower than the top wall 216 of the housing. The perimeter wall 206 may extend between the floor 215 and the top wall 216.

The device 200 comprises a first set of electrical contacts 210 for CSP LEDs 220 and a second independent set of electrical contacts 212 for flip chip LEDs 100. While the contacts 210, 212 are located at respective corners of the housing 202, the contacts can be provided in other locations. Electrically conductive traces 222 for CSP LEDs 220 and electrically conductive traces 224 for the flip chip LEDs 100 are disposed in a layered fashion with at least one layer of dielectric electrically insulating material between the traces 222, 224. This layered arrangement and the elimination of wire bonds 56 allows the LED bonding locations for CSP LEDs 220 and flip chip LEDs 100 to be spaced in close proximity, which improves color uniformity.

Further, the alternating nature CSP LEDs and flip chip LEDs allows such LEDs to be spaced closer than if CSP LEDS only were used. In some embodiments, CSP LEDs and flip chip LEDs effectively be located so that the chip to chip distanced is equivalent to close packing (zero space) between adjacent CPS LED if CPS LEDs only had been used. In some embodiments, the distance between adjacent CSP LEDs 220 and flip chip LEDs 100 is about 0.2 mm or less.

Figure 14:
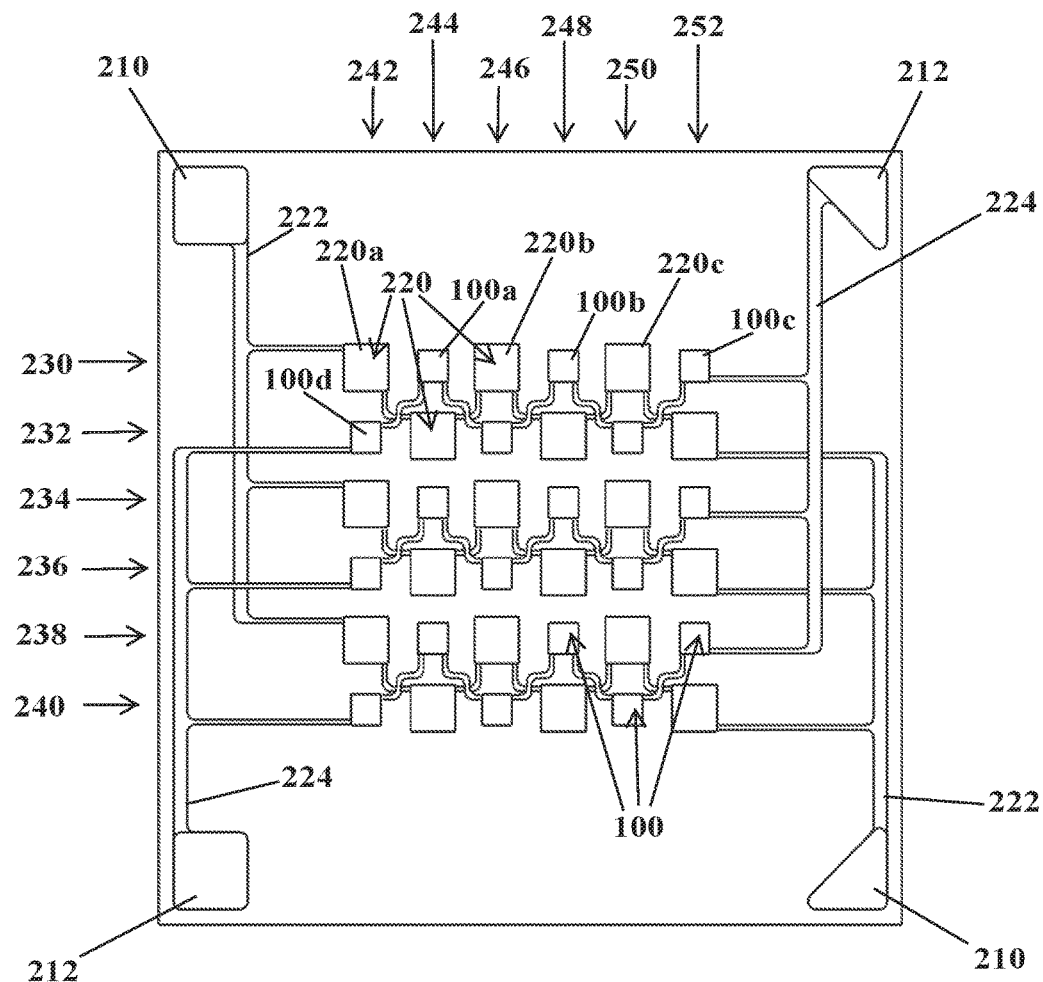
FIG. 14 is a top schematic view a portion of the COB device of FIG. 11.

The CSP LEDs 220 and the flip chip LEDs 100 may be arranged in alternating fashion as shown in FIGS. 11 and 14. For example, FIG. 14 shows six rows 230, 232, 234, 236, 238, and 240 of alternating LEDs and six columns 242, 244, 246, 248, 250, and 252 of alternating LEDs. The first LED in first row 230 is a CSP LED 220a, the second LED is a flip chip LED 100a, the third chip is a second CSP LED 220b, the fourth LED is a second flip chip LED 100b, the fifth LED is a third CSP LED 220c, the sixth LED is a third flip chip LED 100c. The second row begins with a flip chip LED 100d, then next is a CSP LED 220, then proceeds to alternate with flip chip LEDs 100 and CSP LEDs 220. Therefore, in each row and each column, each flip chip LED will be flanked on both sides by a CSP LED, except for the end LEDs at the ends of each row and column, and each CSP LED will be flanked on both sides by a flip chip LED, except for the end LEDs at the ends of the rows and columns.

While the device 200 is shown with a plurality of flip chip LEDs 100 and a plurality of CSP LEDs 220 in FIGS. 11 and 14, in some embodiments, the device 200 comprises at least one flip chip LED and at least one CSP LED. The at least one flip chip LED and at least one CSP LED may be aligned in a row and/or column. In some embodiments, each row, such as row 230, of the device of 200 comprises at least one flip chip LED and at least one CSP LED. In some embodiments, each column, such as column 242, of the device 200 comprises at least one flip chip LED and at least one CSP LED.

In some embodiments, the device 200 has between one and six rows of LEDs and between one and six columns of LEDs, inclusive. In some embodiments, the device 200 has more than six rows of LED and more than six columns of LEDs. In some embodiments, the device has more or less rows than it has columns.

In some embodiments, a row or column of LEDs may comprise at least one CSP LEDs 220 and at least two flip chip LEDs 100, the at least two flip chip LEDs 100 flanking the at least one CSP LED 220 on opposites sides. In some embodiments, a row or column of LEDs may comprise at least two CSP LEDs 220 and at least one flip chip LED 100, the at least two CSP LEDs 220 flanking the at least one CSP LED 220 on opposites sides. In some embodiments, a row or column of LEDs may comprise at least two CSP LEDs 220 and at least two flip chip LED 100, the at least two CSP LEDs 220 the at least two CSP LED 220 arranged in an alternating fashion similar to that shown in FIGS. 11 and 14. Therefore the number of flip chip LEDs and CSP LEDs can be scaled up or down, such as in a combination of rows and/or columns, as desired for a given application.

Figure 15:
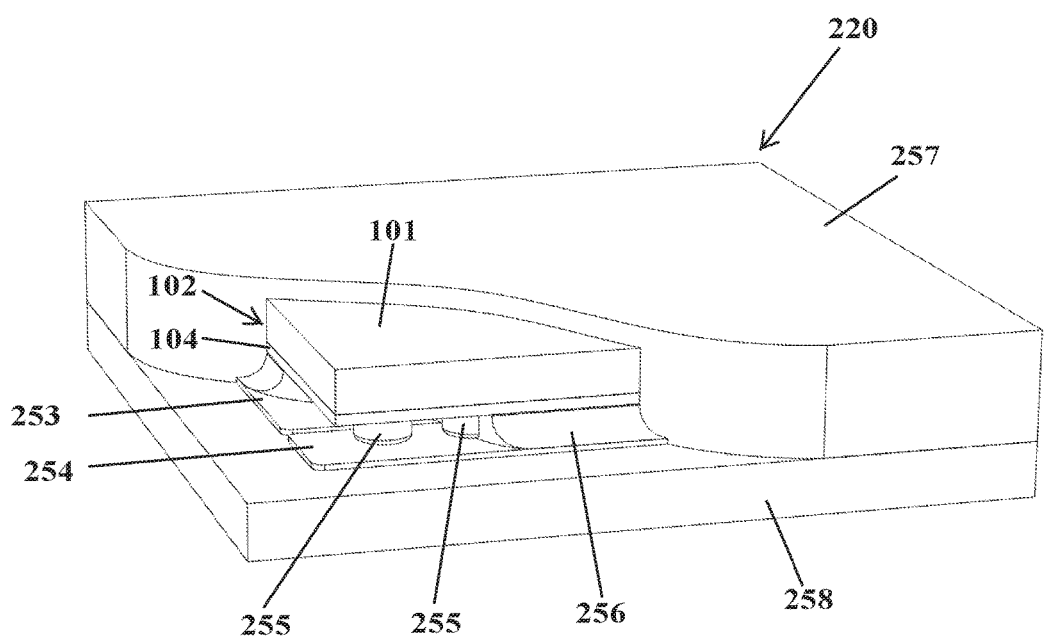
FIG. 15 is a side perspective partial cut-away view of one embodiment of a CSP LED of the COB device of FIG. 11.

FIG. 15 shows an exemplary CSP LED 220. The LED 220 comprises a submount 258, a plurality of submount top electrical contacts 253, 254, a plurality of bump bonds 255, the flip chip 102, an underfill 256, and an encapsulation 257. The flip chip LED 102 used in the CSP LED 220 is the same as flip chip LED 100, except that the phosphor material 115, shown in FIG. 8A, is not provided on the flip chip LED 102. Instead, a phosphor encapsulation 257 is provided about flip chip LED 102. Also an underfill 256 is provided under the flip chip LED 102 about the bump bonds. The remaining substrate mounted elements 109 of flip chip 102 below the substrate 101, such as elements 103, 106, 108, 110, are not shown in detail in FIG. 15.

In some embodiments, the submount 258 comprises a ceramic material, such as alumina. In some embodiments, the underfill comprises a thermally conductive material to dissipate heat, such as a polymer or a polymer filled with inorganic materials.

The bump bonds 255 connect respective electrical contacts 108, 110 to one or more of the submount top electrical contacts 253, 254 to enable connectivity between the submount electrical contacts and the electrical contacts of the flip chip 102. The submount top electrical contacts 253, 254 route to one or more externally connected electrical contacts (not shown) for providing power to the CSP LED.

In some embodiments, a CSP LED may be defined as a type of LED package in which the area of the CSP LED package occupied by LED chip(s) is about 40 percent or more of the total CSP LED package area, the LED package of the CSP LED does not have LED chips assembled on a lead frame, and uses no wire bonds. In some embodiments, the area of the CSP LED package occupied by LED chip(s) is about 50 percent or more of the total CSP LED package area. For a non-limiting example, in the CSP LED 220 of FIG. 15, the CSP LED package occupied by the flip chip 102 is about 82 percent of the overall area of the CSP LED 220.

The difference in a height of CSP LEDs 220 and flip chip LEDs 100 results in a difference in the thickness of encapsulating material 214 over each type of LED. As the CSP LEDs 220 are taller than the flip chip LEDs 100, the encapsulating material 214 will be thicker over the flip chip LEDs 100 than it will be over the CSP LEDs.

In some embodiments, the CSP LED 220 have a height of about 0.45 to 0.50 millimeters (mm). In some embodiments, the flip chip LEDs 100 have a height of about 0.1 mm. The CSP LEDs and the flip chip LEDs can be mounted very close to the mounting surface of the LED area 208 so that the height of the CSP LED and the flip chip LED above the mounting surface will be about the same as the height of the CSP LED and flip chip LED itself, respectively.

In some embodiments, the thickness of the encapsulating material 214 from the floor 215 to a maximum height of the material 214 is in the range of 0.5 to 0.8 mm, inclusive. In some embodiments, the thickness of the encapsulating material 214 from the floor 215 to a maximum height of the material 214 is in the range of 0.55 to 0.65 mm, inclusive. In some embodiments, the encapsulating material 214 has an upper surface 217 that is flat or level so that each location on the upper surface 217 is spaced the same or substantially the same distance from the floor 215 throughout the LED area 208. In some embodiments, the encapsulating material 214 may slope or taper down at or adjacent the perimeter wall 206 while remaining flat elsewhere within the LED area 208.

When phosphor materials are incorporated into the encapsulating material 214 the difference in thickness results in different degrees of interaction between the light emitted by the CSP LEDs 220 and the flip chip LEDs 100. This results in a different spectral power distribution 218 for light emitted from the top of CSP LEDs 220 than the spectral power distribution 219 for the light emitted from the top of the flip chip LEDs 100.

The phosphor containing encapsulating material 214 also serves as an optical scattering medium. This blends and smooths the light distribution from the CSP LEDs 220 and the flip chip LEDs 100. As a result, the COB device 200 demonstrates significantly less dramatic variations in perceived color during operation. This improved uniformity applies for single spectral power distribution COB LED devices as well as color tunable COB LED devices and does not depend on the relative intensity of light emitted by the CSP LEDs 220 and the flip chip LEDs 100. The optical scattering of light by the phosphor spreads the emission of light over a larger area for each light area of light emission whether it be light emitted by the CSP LEDs 220 or the flip chip LEDs 100.

In some embodiments, the phosphor containing encapsulating material 214 is dispensed in liquid form into the LED area 208, where the liquid flow and expands to fill the area under influence of gravity, covers the LEDs located therein and levels uniformly within the LED region 208. In some embodiments, the encapsulating material comprises silicone resin mixed with phosphor. After encapsulating material settles in the LED region 208, it is cured by heating to convert it to a solid gel-like material. In some embodiments, phosphor containing encapsulating material 214 may not cover the top of the CSP LED, as long as the top of the encapsulating material 214 surrounds and is approximately even with the top of the CSP LED.

The phosphor particles of the phosphor containing encapsulating material 214 act as scattering centers which spread the light emitted by the CSP LEDs over a larger area which reduces intensity variations in the COB device 200. In addition, the light emitted from the sides of the CSP LEDs encounters the phosphor mixture that is over the flip chip LEDs. This results in some partial conversion of light from the CSP LEDs so that the total spectral composition changes as well as the intensity of light. Similarly, light emitted by the flip chip LEDs will interact with some of the phosphor contained in the CSP LED packages which also results in a change in the spectral composition of light at the boundary regions of emission from the flip chip LEDs. Thus the COB device 200 not only reduces the intensity variations across the COB package, it also reduces the spectral gradient across the COB package as well. Generally, the thicker the layer of phosphor or the denser the phosphor is within a layer, the more yellow the light emitted therefrom will appear to the viewer when the source of light is a blue LED light.

In some embodiments, one or more of the CSP LEDs, used in the COB device, do not have any phosphor material. This reduces the total amount of phosphor that light from the LED chip 102 inside the CSP LED encounters and thus reduces the degree of wavelength conversion. Light from these CSP LEDs will have a high blue content and such devices may be useful when it is desired to have a light source with a spectral output that is tunable over a wide color gamut.

In another embodiment, one or more of the LED chips 102 in the CSP LEDs 220 or the flip chip LEDs 100 emits light with a wavelength that does not excite one or more phosphor materials. These embodiments are useful when the desired spectral output of devices includes wavelengths that are difficult or impossible to produce efficiently from phosphor materials. Other uses include devices which require a narrow wavelength range that cannot be efficiently produced using phosphor materials.

While device 200 has been described as using the flip chip LED 100, other flip chips could be used, such as flip chip LEDs, 10, 20, or 30 instead of or in addition to flip chip LED 100.

The COB device 200 is not limited to use of a single type of CSP LED package and a single emission wavelength range for the flip chip LEDs. The choice of CSP LED packages and emission wavelength ranges for the flip chip LEDs can vary depending on the intended use of the final device and the availability of phosphor materials that emit in desirable wavelength ranges. Thus embodiments of the COB device may include two, three, four or even more effective spectral channels.

In another embodiment, the COB device may be produced using only CSP LED packages with an encapsulating material. In this embodiment, the encapsulating material over the CSP LED packages comprises a scatter material. In another embodiment, the encapsulating material over the CSP LED packages comprises a phosphor material.

Figure 16:
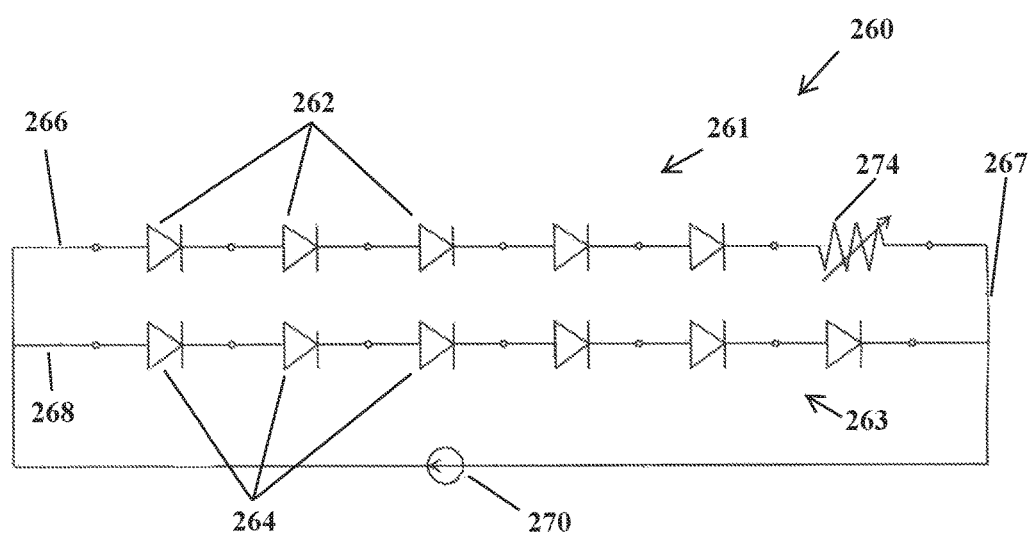
FIG. 16 is a diagram of a variable current delivery circuit of an embodiment of the invention.

FIG. 16 shows a variable current delivery circuit 260. Adding a variable resistance device (VRD) to at least one group of LEDs enables active color tunability with a single current source. Active color tuning results from changing the ratio of electrical current between different groups of LEDs connected to a common current source.

Color tuning may be achieved when the LEDs of the different groups are interspersed between each other, such as is shown in FIG. 11. Color turning may be achieved when the different groups are aligned in separate rows, as is shown in FIG. 5. Color turning may be achieved in other arrangements of LED and groups/strings thereof.

In some embodiments, the circuit 260 comprises two sets of LEDs 261, 263 comprising LEDs 262, 264, respectively. A first set of LEDs 261 is connected in series on string 266 with a variable resistance device (VRD) 274. A second set of LEDs 263 is connected in parallel 267 with the first set of LEDs 261 and the VRD 274 to a single current/power source 270, which may be a constant current power supply. The current applied through the first set of LEDs 261, the VRD 274, and the second set of LEDs 263 will depend on the effective resistance of each string 266, 268.

When the electrical resistance of the VRD 274 increases, the current through the first set of LEDs 261 decreases and simultaneously the current through second set of LEDs 263 increases by the same amount. Conversely, when the electrical resistance of the VRD 274, decreases the current through the first set of LEDs 261 increases and the current through the second set of LEDs 263 decreases by the same amount. The presence of the VRD allows control of the ratio of the current between the first set of LEDs 261 and the second set of LEDs 263. Since both strings 266, 268 are connected to a constant current power supply, the power supply will increase the delivered voltage in order to maintain constant current when electrical resistance of either of the VRDs increases. This causes the current through the other string of LEDs to increase.

Figures 17, 18:
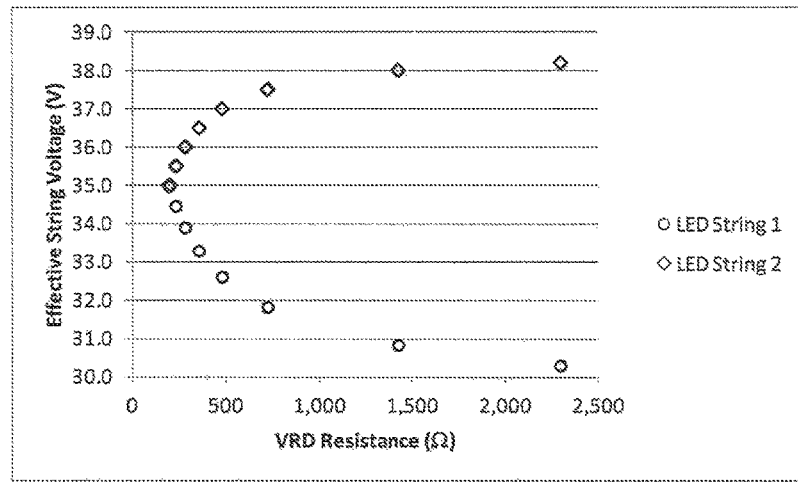
FIG. 17 is a graph of exemplary resistance to voltage values for one embodiment of the circuit of variable current delivery.
FIG. 18 is a table of exemplary resistance to voltage values corresponding to the graph of FIG. 17.

FIGS. 17 and 18 show an exemplary resistance to voltage values for one embodiment of the variable current delivery circuit 260. Varying the resistance of the VRD from about 200 ohms (Ω) to about 2300Ω results in the current ratio between the two strings of LEDs changing from about 1:1 to about 1:20. In another embodiment, where the parallel strings of LEDs with the VRD connected in series were selected to operate at a higher current than the other string at the same effective voltage, then the current ratio could be changed from 20:1 to 1:20.

In some embodiments, because the VRD 274 may take on a range of values, it is not necessary for the first set of LEDs 261 to include the same number of devices as the second set of LEDs 263. Rather the VRD can be user or manufacturer to adjusted account for differencing resistances arising from differencing number of LEDs used in different LED sets.

In some embodiments, the VRD is a field effect transistor (FET). FETs are electrical devices whose resistivity depends on an applied voltage. Since the resistance of an FET depends on the applied voltage, there are many different methods of modifying the current ratio between the first set of LEDs 261 and the second set of LEDs 263, including by using an analog voltage signal, a digital voltage signal or a pulse width modulated voltage signal.

In some embodiments, LED set 261 comprises a plurality of CSP LEDs 220 and LED set 263 comprises a plurality of flip chip LEDs 100, 10, 20, and/or 30.

While two set of LEDs are shown in FIG. 16, more than two sets may be used. Each set may comprise a different spectral power distribution. In some embodiments, ten or more sets of LEDs may be incorporated. Further, it is not necessary for each set of LEDs to include a VRD. When n sets of LEDs are used, a preferred embodiment includes a VRD on n-1 of the sets of LEDs.

Figure 19:
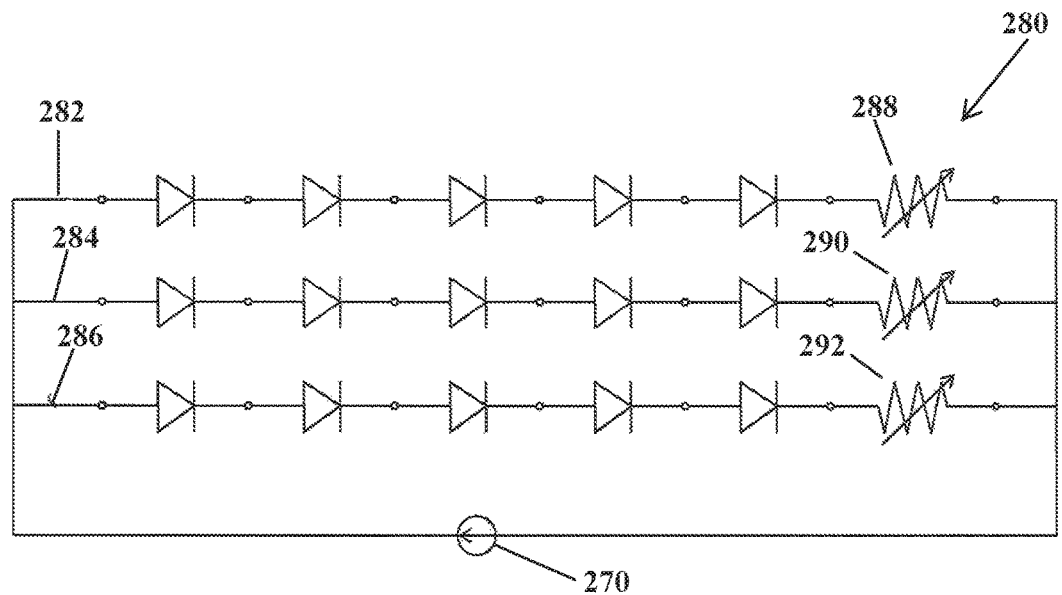
FIG. 19 is a diagram of a second embodiment variable current delivery circuit of an embodiment of the invention.
Figure 20:
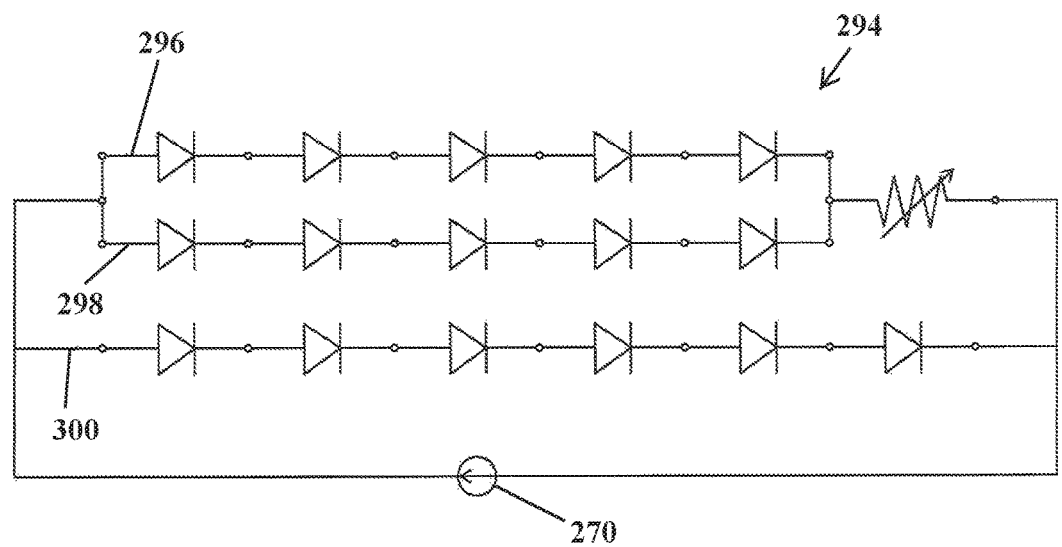
FIG. 20 is a diagram of a third embodiment variable current delivery circuit of an embodiment of the invention.

Although the embodiment 260 uses two parallel strings of LEDs with a single VRD in series with one string of LEDs, different configurations are envisioned. In another embodiment 280, each parallel string 282, 284, 286 of LEDs may include a VRD 288, 290, 292 connected in series, as shown in FIG. 19. In another embodiment 294, more than two parallel strings 296, 298, 300 of LEDs may be used and a VRD 302 may be connected in series with only one or with two string 296, 298 of LEDs, as shown in FIG. 20.

Embodiments are not limited to simple series, parallel connections of LEDs, as if shown in FIG. 16. In some embodiments, a single string of LEDs may be in parallel with a second string that is itself composed of a series, parallel configuration of LEDs.

Figure 21:
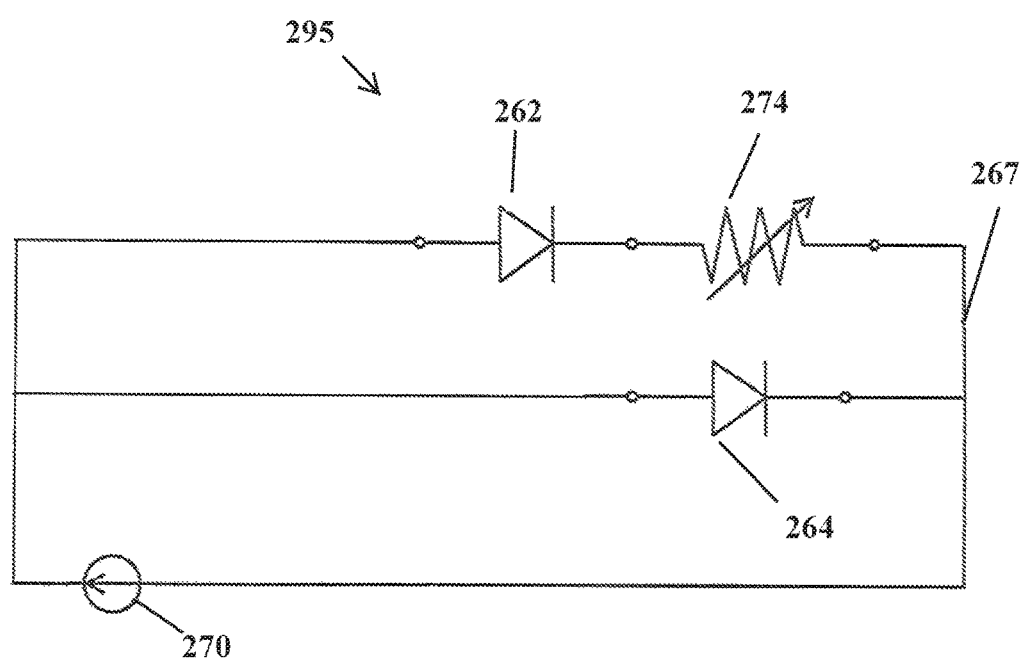
FIG. 21 is a diagram of a fourth embodiment variable current delivery circuit of an embodiment of the invention.

In some embodiments, the VRD(s) 274 may be incorporated into an LED package having a circuit 295 with at least two LED chips 262, 264, as shown in FIG. 21. In some embodiments, the VRD(s) may be incorporated on a circuit board that includes at least two LED packages. In some embodiments, the VRD(s) may also be present on circuit boards that supply current to LED packages, light engines or light modules.

Not only can a variable current delivery circuit 260, 280, 294, 295 achieve color tuning, but it may instead or in addition, be used to change the intensity distribution of light from a light device/fixture. For example, when a first string/group of LED are located on one side or portion of a light fixture and a second string/group of LED are located on a second side or portion, the increasing of the light intensity from one group of LEDs and the decreasing of light intensity from the other group can change the intensity distribution of light from a light fixture.

Figure 22:
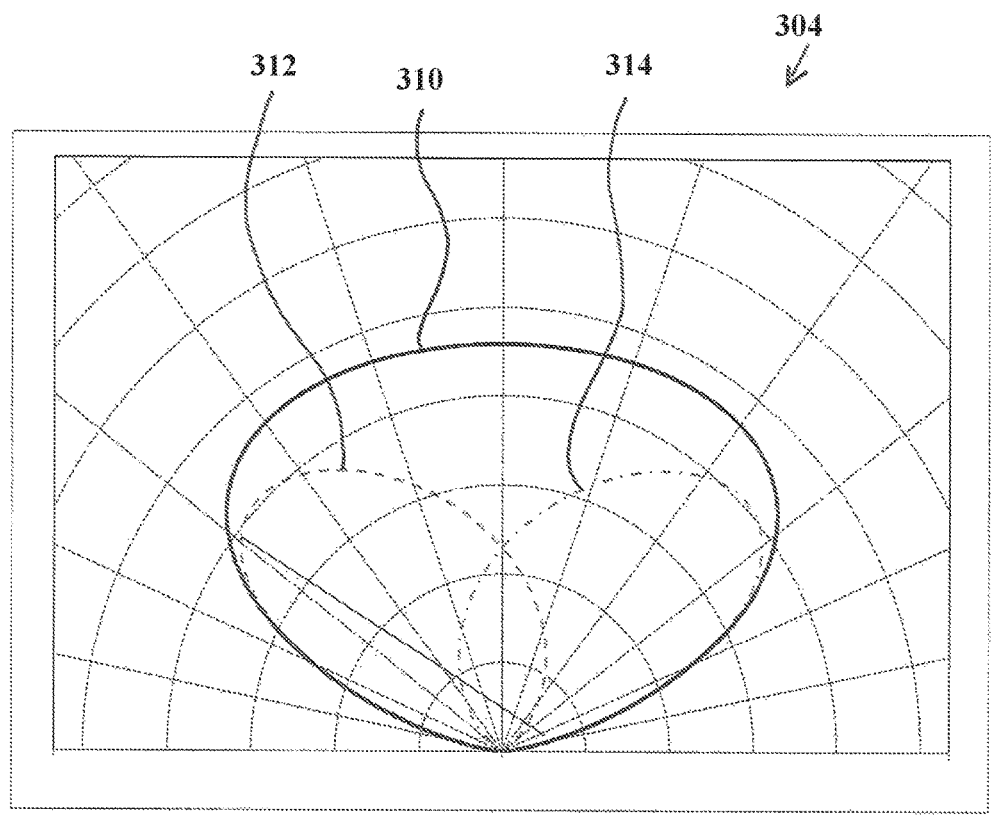
FIG. 22 is an exemplary polar distribution plot from a light fixture having a first group of LEDs and a second group of LEDs.
Figure 23:
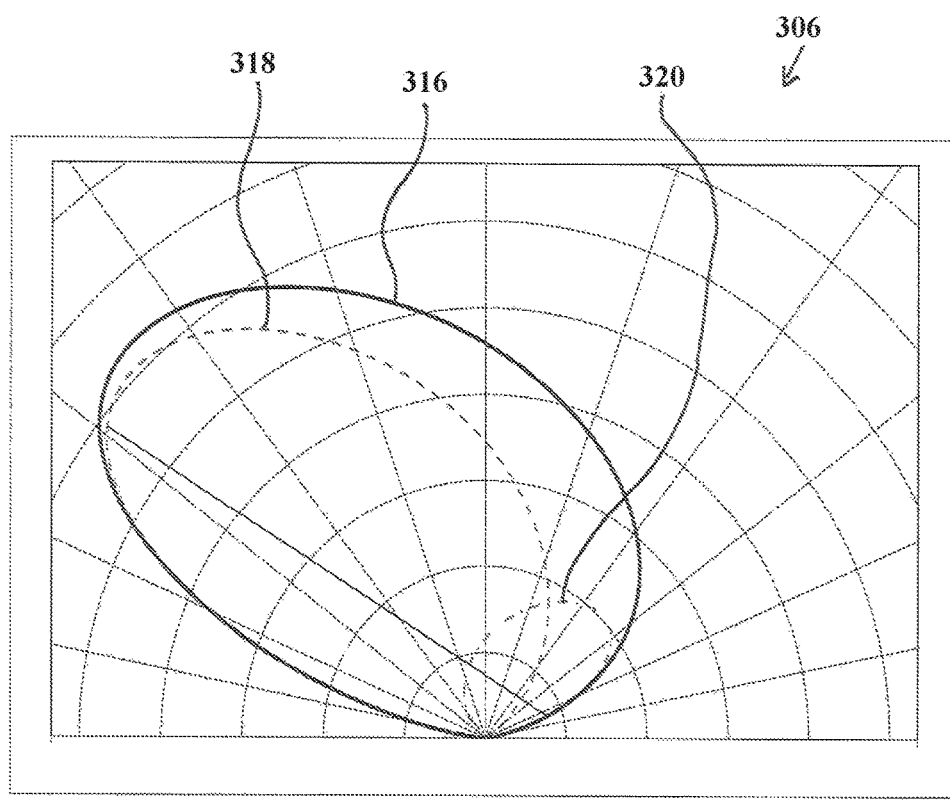
FIG. 23 is an exemplary polar distribution plot from a light fixture having a first group of LEDs and a second group of LEDs were light is distributed to the left side.
Figure 24:
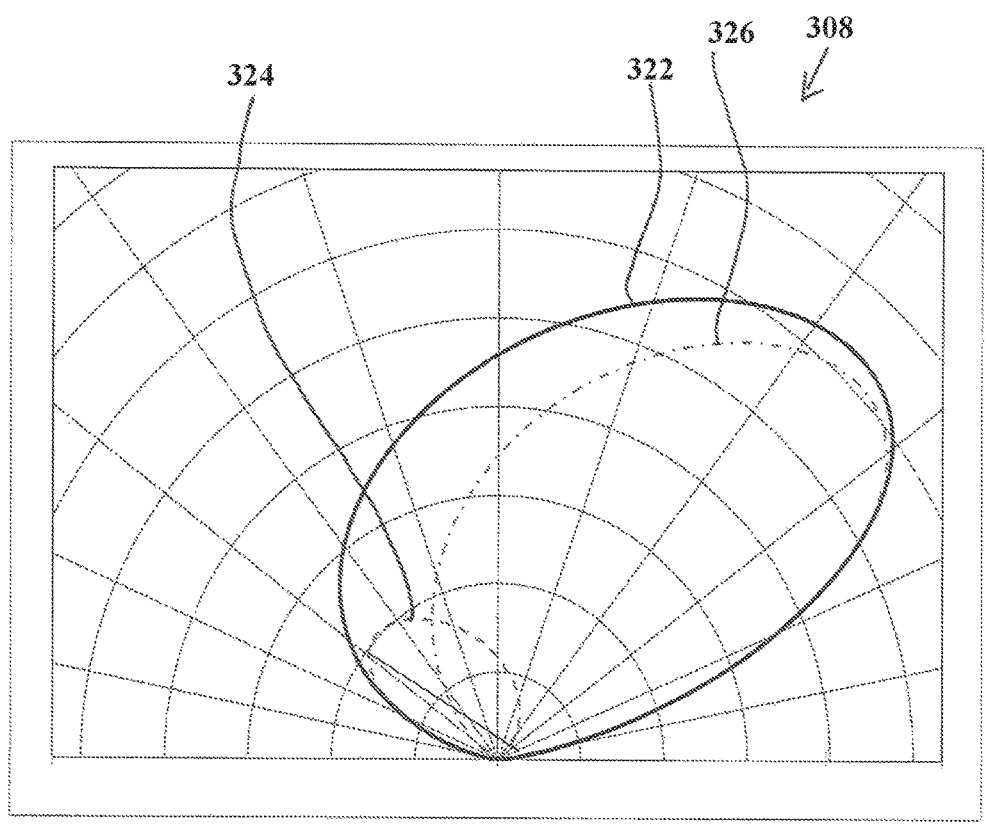
FIG. 24 is an exemplary polar distribution plot from a light fixture having a first group of LEDs and a second group of LEDs were light is distributed to the right side.

FIGS. 22 through 24 show exemplary polar distribution plots 304, 306, 308 from a light fixture having a first group of LEDs and a second group of LEDs. In one application, the first group of LED can be LEDs 262 of string 266 with VRD 274 and the second group of LEDs can be LEDs 264 of string 268 from FIG. 16. The plots show the intensity of light as a function of angle. This is simplified to represent a fixture with two strings of LEDs, however any number of strings could be used. Each string has one or more LEDs. One string produces light 312 that is emitted primarily towards the left side and the other string produces light 314 that is emitted primarily towards the right side. The plot 304 of FIG. 22 shows the fixture light emission 310 corresponding to the application of equal or substantially equal power to the first and second groups of LEDs. The intensity of the light 312 emitted from the left side group of LEDs is the same or substantially the same as the intensity of the light 314 emitted from the right side group of LEDs.

The plot 306 of FIG. 23 shows the fixture light emission 316 corresponding to the application of more power to the left side group of LEDs and less power to the right side group of LEDs. Therefore, the intensity of the light 318 emitted from the left side group of LEDs is greater than the intensity of the light 320 emitted from the right side group of LEDs. This results in the fixture light emission directed toward the left side as shown in the plot 306.

Plot 308 of FIG. 24 shows the fixture light emission 322 corresponding to the application of more power to the right side group of LEDs and less power to the left side group of LEDs. Therefore, the intensity of the light 326 emitted from the right side group of LEDs is greater than the intensity of the light 324 emitted from the left side group of LEDs. This results in the fixture light emission directed toward the right side as shown in the plot 308.

As a result, the use of a VRD to change the power delivered to different strings of LEDs can shift the direction that light is emitted from a light fixture. In some applications, this might result in a moveable spotlight effect that is aimable by changing the resistance applied to the circuit by the VRD.

From the foregoing, it will be observed that numerous variations and modifications may be effected without departing from the spirit and scope of the invention. It is to be understood that no limitation with respect to the specific apparatus illustrated herein is intended or should be inferred. For example, one or more component or embodiments may be combined, modified, removed, or supplemented to form further embodiments within the scope of the invention. As a further example, steps provided could be carried out in a different order to achieve desired results. Further, steps could be added or removed from the processes described. Therefore, other embodiments and implementations are within the scope of the invention.

The invention claimed is:

1. A LED device, comprising:
    an LED area
    a boundary element surrounding the LED area;
    a plurality of chip scale package LEDs in the LED area;
    a plurality of flip chip LEDs in the LED area;
    an encapsulate covering the plurality of chip scale package LEDs and the plurality of flip chip LEDs in the LED area, the encapsulate comprising phosphor;
    a first conductive path connecting the plurality of chip scale package LEDs;
    a second conductive path connecting the plurality of flip chip LEDs; and,
    the plurality of chip scale package LEDs and the plurality of flip chip LEDs in the LED area are arranged in at least one row, the at least one row comprises alternating chip scale package LEDs and flip chip LEDs.

2. The device of claim 1, wherein the at least one row comprises a flip chip LED of the plurality of flip chip LEDs between adjacent chip scale package LEDs of the plurality of chip scale package LEDs.

3. The device of claim 1, wherein the at least one row comprises a chip scale package LED of the plurality of chip scale package LEDs between adjacent flip chip LED of the plurality of flip chip LEDs.

4. The device of claim 1, comprising a constant current power supply configured to deliver power to the first conductive path and second conductive path.

5. The device of claim 1, wherein a thickness of the encapsulate above the chip scale package LEDs is less than a thickness of the encapsulate above the flip chip LEDs.

6. The device of claim 5, wherein a top surface of the encapsulate is flat.

7. The device of claim 1, wherein each of the chip scale package LEDs of the plurality of chip scale package LEDs is larger than each of the flip chip LEDs of the plurality of flip chip LEDs.

8. The device of claim 1, wherein each of the chip scale package LEDs of the plurality of chip scale package LEDs comprises a height that is larger than a height each of the flip chip LEDs of the plurality of flip chip LEDs.

9. The device of claim 1, wherein a first current applied to the plurality of chip scale package LEDs is different from a second current applied to the plurality of flip chip LEDs.

10. The device of claim 1, comprising a variable resistance device, wherein the plurality of chip scale package LEDs are arranged in a first series on the first conductive path, the plurality of flip chip LEDs are arranged in a second series in the second conductive path, the variable resistance device is provided in series in the first or second conductive paths.

11. The device of claim 10, wherein the variable resistance device is a field effect transistor.

12. The device of claim 1, wherein each of the plurality of flip chip LEDs comprise open lateral sides.

13. The device of claim 1, wherein the plurality of chip scale package LEDs each comprise a flip chip LED of a second plurality of flip chip LEDs.

14. A chip-on-board LED device, comprising:
    an LED area
    a boundary element surrounding the LED area;
    a plurality of chip scale package LEDs in the LED area;
    a plurality of flip chip LEDs in the LED area;
    an encapsulate in the LED area covering the plurality of flip chip LEDs and surrounding the plurality of chip scale package LEDs, the encapsulate comprising phosphor;
    a first conductive path connecting the plurality of chip scale package LEDs;
    a second conductive path connecting the plurality of flip chip LEDs;
    the plurality of chip scale package LEDs and the plurality of flip chip LEDs in the LED area are arranged at least one row, the at least one row comprises alternating chip scale package LEDs and flip chip LEDs.

15. The device of claim 14, wherein the plurality of chip scale package LEDs and the plurality of flip chip LEDs in the LED area are arranged in a plurality of rows, each row comprises alternating chip scale package LEDs and flip chip LEDs, and each row comprises a flip chip LED of the plurality of flip chip LEDs between adjacent chip scale package LEDs of the plurality of chip scale package LEDs.

16. The device of claim 14, wherein the plurality of chip scale package LEDs and the plurality of flip chip LEDs in the LED area are arranged in a plurality of rows, each row comprises alternating chip scale package LEDs and flip chip LEDs, each row comprises a chip scale package LED of the plurality of chip scale package LEDs between adjacent flip chip LED of the plurality of flip chip LEDs.

17. The device of claim 14, wherein a thickness of the encapsulate above the chip scale package LEDs is less than a thickness of the encapsulate above the flip chip LEDs.

18. A method of manufacturing a LED device comprising the steps of:
    arranging a plurality of chip scale package LEDs and a plurality of flip chip LEDs in rows in a LED area of the LED lighting device wherein each row comprises alternating chip scale package LEDs and flip chip LEDs, and wherein the plurality of chip scale package LEDs are connected to a first conductive path in the LED area, and the plurality of flip chip LEDs are connected to a second conductive path in the LED area;
    dispensing a liquid encapsulating material into the LED area bounded by a dam member;
    allowing the liquid encapsulating material to level by gravity; and,
    curing the liquid encapsulating material.

19. The method of claim 18, wherein the step of allowing is further defined in that a thickness of the encapsulate above the chip scale package LEDs is less than a thickness of the encapsulate above the flip chip LEDs.

20. The method of claim 18, comprising the step of varying the current delivered to a plurality of chip scale package LEDs and a plurality of flip chip LEDs by the adjustment of a variable resistance device located on the first or second conductive path.

21. The device of claim 1, wherein the plurality of chip scale package LEDs and the plurality of flip chip LEDs in the LED area are arranged in a plurality of rows, each row comprises alternating chip scale package LEDs and flip chip LEDs.

* * * * *